(12) United States Patent
Ehm et al.

(10) Patent No.: US 9,249,501 B2
(45) Date of Patent: Feb. 2, 2016

(54) SURFACE CORRECTION ON COATED MIRRORS

(75) Inventors: Dirk Heinrich Ehm, Lauchheim (DE); Franz-Josef Stickel, Aalen (DE); Juergen Mueller, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 659 days.

(21) Appl. No.: 13/475,173

(22) Filed: May 18, 2012

(65) Prior Publication Data

US 2012/0300184 A1 Nov. 29, 2012

Related U.S. Application Data

(60) Provisional application No. 61/487,388, filed on May 18, 2011.

(51) Int. Cl.
| | |
|---|---|
| *G03B 27/52* | (2006.01) |
| *C23C 14/48* | (2006.01) |
| *G03B 7/20* | (2006.01) |
| *G02B 26/08* | (2006.01) |
| *G03F 7/20* | (2006.01) |
| *G21K 1/06* | (2006.01) |
| *G02B 17/06* | (2006.01) |

(52) U.S. Cl.
CPC ............ *C23C 14/48* (2013.01); *G02B 26/0825* (2013.01); *G03B 7/20* (2013.01); *G03F 7/7095* (2013.01); *G03F 7/70266* (2013.01); *G03F 7/70316* (2013.01); *G21K 1/062* (2013.01); *G02B 17/0657* (2013.01)

(58) Field of Classification Search
CPC ............... C23C 14/48; G02B 17/0657; G02B 26/0825; G03B 7/20

USPC ........ 355/67, 30; 359/846, 727; 427/162, 523
See application file for complete search history.

(56) References Cited

U.S. PATENT DOCUMENTS

| 8,753,788 B1 * | 6/2014 | Yu ............................. G03F 1/72 356/237.4 |
| 2005/0117233 A1 | 6/2005 | Kanazawa et al. |
| 2006/0007433 A1 | 1/2006 | Ikuta et al. |
| 2007/0091420 A1 | 4/2007 | Hosoya et al. |
| 2007/0091421 A1 | 4/2007 | Hosoya et al. |
| 2011/0189593 A1 * | 8/2011 | Ogawa et al. ..................... 430/5 |

(Continued)

FOREIGN PATENT DOCUMENTS

| DE | 102009029471 A1 | 3/2011 |
| EP | 1306698 A1 | 5/2003 |

(Continued)

*Primary Examiner* — Deoram Persaud
(74) *Attorney, Agent, or Firm* — Edell, Shapiro & Finnan LLC

(57) ABSTRACT

A mirror (1) for a microlithography projection exposure apparatus including a substrate (3) and a reflective coating (5). A functional coating (11) between the substrate (3) and the reflective coating (5) has a local form variation (19) for correcting the surface form of the mirror (1), wherein the local form variation (19) is brought about by a local variation in the chemical composition of the functional coating (11) and wherein a thickness of the reflective coating (5) is not changed by the local variation in the chemical composition of the functional coating (11). The local variation in the chemical composition of the functional coating (11) can be brought about by bombardment with particles (15), for example with hydrogen ions.

16 Claims, 5 Drawing Sheets

(56) References Cited

U.S. PATENT DOCUMENTS

| | | | |
|---|---|---|---|
| 2011/0279799 A1* | 11/2011 | Singer | G03F 1/86 355/53 |
| 2012/0229784 A1* | 9/2012 | Rocktaeschel | G02B 5/0833 355/55 |
| 2014/0078481 A1* | 3/2014 | Mueller | G02B 5/0891 355/67 |

FOREIGN PATENT DOCUMENTS

| | | |
|---|---|---|
| EP | 1947682 A1 | 7/2008 |
| WO | 2011032813 A1 | 3/2011 |

* cited by examiner

SURFACE CORRECTION ON COATED MIRRORS

This Application claims benefit of U.S. Provisional Application No. 61/487,388, filed May 18, 2011, which is incorporated in its entirety into this application by reference.

FIELD AND BACKGROUND OF THE INVENTION

The present invention relates to a mirror for use in a microlithography projection exposure apparatus having a substrate and a reflective coating, to a projection lens for use in a microlithography projection exposure apparatus, to a microlithography projection exposure apparatus and also to a method for correcting a surface form of a mirror having a substrate and a reflective coating.

Microlithography projection exposure apparatuses serve for producing microstructured components by means of a photolithographic method. In this case, a structure-bearing mask, the so-called reticle, is imaged onto a photosensitive layer with the aid of a projection optical unit. The minimum feature size that can be imaged with the aid of such a projection optical unit is determined by the wavelength of the imaging light used. The smaller the wavelength of the imaging light used, the smaller the structures that can be imaged with the aid of the projection optical unit. Nowadays, imaging light having a wavelength of 193 nm or imaging light having a wavelength in the extreme ultraviolet (EUV) range, i.e. 5 nm-30 nm, is principally used. When imaging light having a wavelength of 193 nm is used, both refractive optical elements and reflective optical elements are employed within the microlithography projection exposure apparatus. By contrast, when imaging light having a wavelength in the range of 5 nm-30 nm is used, exclusively reflective optical elements (EUV mirrors) are used.

In order to enable a good imaging of the structure-bearing mask onto the photosensitive layer, it is necessary for the imaging aberrations or the wavefront aberrations of the projection optical unit to be reduced as far as possible. Therefore, it is necessary to ensure the surface form of, in particular, the mirrors used within the projection optical unit with a high precision.

For correcting the surface form of EUV mirrors, it is known to at least partially locally remove the topmost layer of the reflective coating. However, the layer removal required in this respect is large with respect to the wavefront aberration to be corrected. For correcting the surface form of the mirror, the surface form of the substrate can also be adapted suitably, before the reflective coating is applied, by being locally removed. In this case, however, it is not possible to correct those wavefront aberrations which only arise as a result of the application of the reflective coating or as a result of local changes in the reflective coating during operation.

OBJECTS AND SUMMARY OF THE INVENTION

Accordingly, it is an object of the present invention to provide a mirror with a surface form which is determined with a high precision.

According to one formulation of the present invention, this object is achieved by a mirror for use in a microlithography projection exposure apparatus comprising a substrate and a reflective coating. This mirror is characterized in that a functional coating between the substrate and the reflective coating has a local form variation for correcting the surface form of the mirror, wherein the local form variation is brought about by a local variation in the chemical composition of the functional coating and a thickness of the reflective coating is not changed by the local variation in the chemical composition of the functional coating.

The local variation in the chemical composition leads to a change in structure within the material of the functional coating and therefore to a local variation in the density and thickness of the functional coating, as a result of which the surface form of the mirror can be set very precisely. In the case of such a mirror, it is also possible for the surface form to be changed to some extent without the reflective coating having to be removed and then reapplied.

The correction of the surface form of the mirror with the aid of a form variation of the functional coating, with the functional coating having local variations in density, provides the further advantage that only the form of the functional coating is changed. The retention of the thickness of the reflective coating, with a variation in the chemical composition of the reflective coating, makes it possible for the reflectivity of the mirror not to be impaired by the correction of the surface form. The mirror substrate, too, and therefore the mirror body remain unchanged, and therefore mechanical components which are connected to the mirror substrate are not adversely affected. In this respect, the functional coating can be arranged directly on the substrate or, if appropriate, on a protective layer applied to the substrate (substrate protection layer) or the like.

In one development of the mirror, the local variation in the chemical composition of the functional coating is brought about by bombardment with particles. This has the advantage that the change in density can be made in a contactless manner. Thus, for example, damage to the reflective coating can be largely avoided, if the depth of penetration upon bombardment of the functional coating is selected such that the particles are deposited substantially in the material of the functional coating and not in the overlying reflective coating. In order to penetrate the reflective coating, it is generally necessary to accelerate the particles at high kinetic energies. Since particles can be accelerated in a particularly simple manner in electric and/or magnetic fields, it is favorable if charged particles are used for the bombardment.

Hydrogen ions ($H^+$ ions), in particular, have proved to be favorable as charged particles for the bombardment. Hydrogen is the ideal candidate for the bombardment, since, on account of its small size, it can easily penetrate into the functional coating to be changed, and the reaction products which form are generally sufficiently small to escape again from the solid body. Alternatively, oxygen molecules or oxygen ions can also serve as particles, in particular for carbon-containing functional coatings. In any case, the kinetic energy of the particles should be adapted here such that the mean value of the distribution of the depth of penetration lies in the region of the functional coating. What are typically required for this purpose are ion energies lying in the range of several 100 eV, i.e. rapid hydrogen ions as are generated by an ion gun. An ion gun typically makes it possible to vary the energies of the charged particles accelerated for the bombardment within wide limits.

In one embodiment, the functional coating contains a material which chemically reacts with the particles. The chemical reaction locally changes the density of the material present in the functional coating and therefore the volume or the thickness of the functional coating.

In one development, the functional coating contains a hydrogen-reactive material. Within the context of the present application, a hydrogen-reactive material is understood to mean a material with which the hydrogen ions chemically react. The chemical reaction has the effect of changing the density of the hydrogen-reactive material.

The hydrogen-reactive material can be, for example, carbon, silicon or a hydrogen-reactive metal. If appropriate, the hydrogen-reactive material may also be one or more hydrocarbons, which are converted by a reaction with hydrogen into atomic carbon. Such a change in the chemical composition can arise as a result of physical interactions, e.g. in the form of collision processes possibly with subsequent conversion into another chemical compound.

In one embodiment, the local variation in the chemical composition of the functional coating generates a local increase in the volume of the functional coating. The local increase in the volume of the functional coating typically results from a reduction in the density of the material present in the functional coating, which occurs when said material is present in the changed chemical state following the chemical reaction with the particles. By way of example, carbon can react with hydrogen ions to form volatile hydrocarbons, silicon can react with hydrogen ions to form silane and hydrogen-reactive metals, for example Sn, Zn, In, etc., and also rare earth metals can form hydrides with the hydrogen ions, this being associated in each case with a local decrease in the density of the hydrogen-reactive material and an accompanying local rise in the volume of the hydrogen-reactive material.

It shall be understood that, instead of a local increase in the volume of the, for example hydrogen-reactive, material present in the functional coating, a local decrease in the volume or an increase in the density can also be generated upon bombardment with hydrogen ions or with other particles. By way of example, hydrogen can react with silicon to form short-chain silanes which can escape into the surroundings through the grain boundaries in the reflective coating.

In one development, the local variation in the chemical composition of the functional coating is irreversible. This has the advantage that the mirror remains in the changed chemical state after the bombardment without it being necessary to continuously act thereon.

A projection lens comprising a mirror according to the invention and a microlithography projection exposure apparatus comprising such a projection lens have the advantages which are already described above with reference to the mirror according to the invention. Here, the projection lens can have exclusively mirrors or also additional lens elements.

The invention likewise relates to a method for correcting a surface form of a mirror comprising a substrate and a reflective coating. Here, the method is characterized in that it comprises at least the following step: generating a local form variation in a functional coating, which is arranged between the substrate and the reflective coating, by a local variation in the chemical composition of the functional coating, wherein a thickness of the reflective coating is not changed by the local variation in the chemical composition of the functional coating.

Such a method has the advantage that the surface form of the mirror can be set very precisely. Such a method can be carried out either before the optical system in which the mirror is employed is commissioned, or else as part of a maintenance or restoration measure. This has the advantage that, once the optical system has been operated for a certain length of time and certain changes have arisen in the optical properties as a result of operation, the surface form of at least one mirror can be changed in order to compensate for the changes. Such a maintenance measure makes it possible to realize the desired optical properties over a long period of operation. Here, it is possible to carry out such a maintenance measure by demounting the mirror, taking it to a special apparatus, in order to correct the surface form there, and then remounting it. Alternatively, the apparatus with the optical system can comprise a suitable device such that it is possible to correct the surface form of at least one mirror without demounting said mirror.

This method according to the invention can be developed further in such a way that the local irreversible change in density is effected while the mirror has the reflective coating. This has the advantage that the surface form of a mirror can be changed to some extent without the reflective coating having to be removed and reapplied. As has been described above, the method is characterized in that a thickness of the reflective coating is not changed by the local variation in the chemical composition of the functional coating. This can have the effect that the reflectivity of the mirror is not impaired by the method for correcting the surface form.

In one development, the local variation in the chemical composition of the functional coating is effected by bombardment with particles. Particularly if the functional coating contains a hydrogen-reactive material, it reacts particularly sensitively to the bombardment with charged particles in the form of hydrogen ions, such that a change in the local density of the functional coating can be realized in a particularly simple manner.

In one development, the kinetic energy of the particles is determined depending on the thickness of the reflective coating. The kinetic energy of the particles is typically selected in this case in such a way that the majority of the particles are deposited in the material of the functional layer. It can thereby be ensured that only a small proportion of the particles are deposited within the reflective coating, and therefore the optical properties thereof are not changed or are changed only insignificantly by the bombardment.

In a further variant, the particles chemically react with a material present in the functional coating, in order to generate a local variation in the density and therefore the volume of the functional coating, i.e. the material present in the functional coating has a different density before the chemical reaction with the particles than after the chemical reaction with the particles.

In one variant, the local variation or change in the chemical composition of the functional coating generates a local increase in the volume of the functional coating. In this case, the material which chemically reacts with the particles has a lower density in its chemical state after the chemical reaction than before the chemical reaction.

In one development, the variation in the chemical composition is irreversible. This has the advantage that the mirror remains in the changed chemical state without it being necessary to continuously act thereon.

The invention furthermore relates to a method for correcting the imaging properties of a projection optical unit of a microlithography projection exposure apparatus comprising a method described above for correcting a surface form of at least one mirror of the projection optical unit. Therefore, such a method for correcting the imaging properties has the advantages which are described above with reference to the method for correcting a surface form.

The invention also relates to a method for correcting the imaging properties of a projection optical unit of a microlithography projection exposure apparatus comprising:
  a. determining the wavefront aberrations of the projection optical unit,
  b. calculating a correction surface form of at least one mirror from the wavefront aberrations of the projection optical unit, and c. correcting a surface form of the at least one mirror by the method described above.

Such a method for correcting the imaging properties has the advantages which are already described above with reference to the method for correcting a surface form.

BRIEF DESCRIPTION OF THE DRAWINGS

Exemplary embodiments are illustrated in the schematic drawing and are explained in the following description.

DETAILED DESCRIPTION OF EXEMPLARY EMBODIMENTS

Figure 1A:
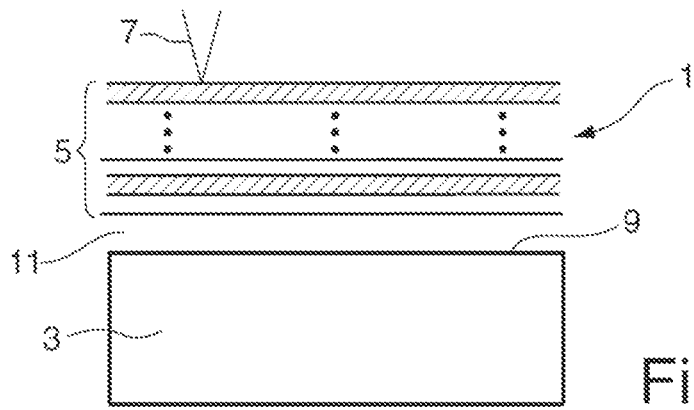
FIG. 1a is a schematic illustration of an exemplary embodiment of a mirror before correction of the surface form, FIGS. 1 b,c are each a schematic illustration of the mirror after correction of the surface form by bombardment with hydrogen ions.

FIG. 1a schematically shows an exemplary embodiment of a mirror 1 for use in a microlithography projection exposure apparatus in an initial state before correction of the surface form. The mirror 1 comprises a substrate 3 and a reflective coating 5.

If the mirror 1 is to be used in a projection exposure apparatus which uses imaging light having a wavelength in the range of 5 nm-30 nm, the substrate 3 consists of a material having a very low coefficient of thermal expansion (CTE) of typically less than 100 ppb/K at 22° C. or over a temperature range of approximately 5° C. to approximately 35° C. A material which has these properties is silicate or quartz glass doped with titanium dioxide, which typically has a silicate glass proportion of more than 90%. One such silicate glass that is commercially available is sold by Corning Inc. under the trade name ULE® (Ultra Low Expansion glass). A further group of materials which has a very low coefficient of thermal expansion are glass ceramics, in which the ratio of the crystal phase to the glass phase is set such that the coefficients of thermal expansion of the different phases virtually cancel one another out. Such glass ceramics are offered, for example, under the trade name Zerodur® from Schott AG or under the trade name Clearceram® from Ohara Inc.

If the mirror 1 is to be used in a projection exposure apparatus which is operated with imaging light at wavelengths of more than 150 nm, e.g. approximately 193 nm, materials having a higher coefficient of thermal expansion, for example quartz glass ($SiO_2$), can be used for the substrate 3.

The reflective coating 5 consists of a plurality of individual layers that consist of different materials. If the mirror 1 is designed to reflect imaging light 7 having a wavelength in the range of 5 nm-30 nm, the reflective coating 5 comprises individual layers which consist alternately of materials having different refractive indices. If the imaging light 7 has a wavelength in the region of 13.5 nm, the individual layers usually consist of molybdenum and silicon. Other material combinations, e.g. molybdenum and beryllium, ruthenium and beryllium or lanthanum and $B_4C$, are likewise possible. In addition to the individual layers described, reflective coatings 5 of this type can also include intermediate layers for preventing diffusion or surface layers for preventing oxidation and corrosion. Auxiliary layers of this type have not been illustrated in the figures. If the mirror 1 is operated with imaging light at wavelengths of more than 150 nm, the reflective coating 5 generally likewise has a plurality of individual layers which consist alternately of materials having different refractive indices.

In the exemplary embodiment shown, the mirror 1 has a planar surface. This has only been selected in this way for better illustration of the correction method according to the invention. Even in the initial state, the mirror 1 can have a curved surface form. Concave surface forms and convex surface forms are possible, for example. The surface forms can be both spherical and aspherical. After production, a mirror 1 of this type can be measured with the aid of interferometric methods. These are, for example, shearing interferometry, point-diffraction interferometry, the Foucault method, the Ronchi test, the Hartmann test or the Shack-Hartmann test. A description of these known methods can be found, for example, in EP 1306698 A1.

For these measurement methods, it is usually necessary for the mirror 1 to already have a reflective coating 5. What is obtained as a result of these measurements is the so-called actual surface form, i.e. precise information relating to the actual surface form of the present mirror 1. If the result of the measurement of the surface form is that the actual surface form deviates from the desired surface form, it is necessary to correct the surface form. This can be done, for example, by removing the reflective coating of the mirror again and then correcting the form of the surface 9 of the substrate 3 with the aid of, for example, ion beams (ion beam figuring). However, this procedure has the disadvantage that the reflective coating 5 firstly has to be removed before the surface 9 can be corrected. Following correction of the surface form, a reflective coating is reapplied and the surface form is measured again. It is often the case, however, that the desired surface form is not achieved by a correction step, and therefore renewed correction of the surface form is required. Therefore, this correction method includes frequent recoating of the mirror 1, which makes the correction method very time-consuming and cost-intensive. Furthermore, there is also always the risk that the newly applied reflective coating 5 does not satisfy the desired requirements and therefore the entire process may have to be repeated more frequently.

These disadvantages are overcome by the correction method according to the invention. The inventors have realized that it is favorable to introduce a functional coating 11 between the substrate 3 and the reflective coating 5 in order to correct the surface form of the mirror 1. This exploits the fact that the chemical composition of the functional coating 11 can be changed locally, as a result of which a local variation in the density and therefore in the form of the functional coating 11 which brings about correction of the surface form of the mirror 1 is generated. The functional coating 11 in this case comprises a material with a density which can be changed irreversibly, i.e. permanently. In the exemplary embodiment shown in FIG. 1a, the functional coating 11 is applied directly to the substrate 3. This is not absolutely necessary, however; instead, the functional coating 11 can also be applied to a protective layer arranged on the substrate 3 (substrate protection layer) or the like.

In the present example, the functional coating 11 consists of a hydrogen-reactive material, i.e. of a material which can chemically react with hydrogen, more precisely with hydrogen ions, and in the process undergoes a change in its density.

Figure 1B:
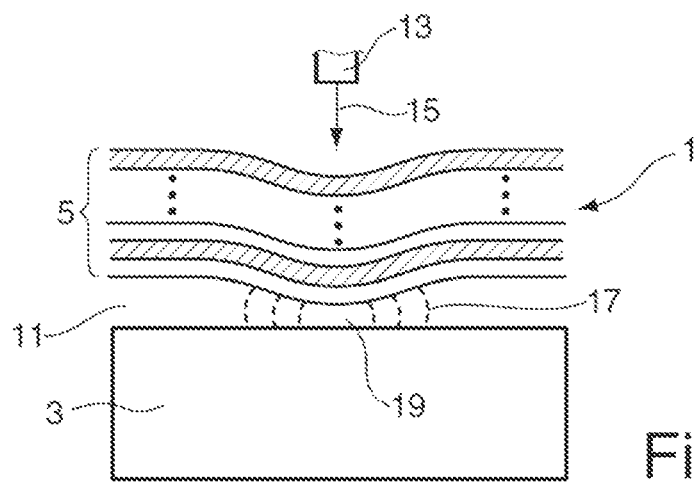

An ion gun 13 which generates a spatially localized particle beam of hydrogen ions 15 ($H^+$ ions) can serve for the local deposition of hydrogen ions in the functional coating 11 (cf. FIG. 1b). If this particle beam is directed at the mirror 1, the hydrogen ions are deposited in the functional coating 11, this being limited spatially to a region 19 in which the deposition leads to a local change in the chemical composition of the hydrogen-reactive material. Isodensity lines 17 of the functional coating 11, which are shown in FIG. 1b, indicate that a local densification in the bombarded region 19 has occurred, leading to a decrease in the thickness of the functional coating 11 in the bombarded region 19. In the example shown in FIG. 1c, the bombardment with hydrogen ions leads to the opposite effect, i.e. the chemical reaction leads to a decrease in the density of the functional coating 11 and therefore to an increase in the thickness of the functional coating 11 in the bombarded region 19.

The hydrogen-reactive material may be, for example, carbon, silicon, a rare earth metal, etc. Carbon can react with the hydrogen to form volatile hydrocarbons, silicon can react with the hydrogen to form silanes and the rare earth metals or selected hydrogen-reactive metals can form hydrides, where in each case the density of the material of the functional coating 11 changes locally, to be precise typically decreases, as shown in FIG. 1c.

By moving the ion gun 13 along the surface of the mirror 1, it is therefore possible to carry out local variations in density on the functional coating 11 for correcting the surface form of the mirror 1. In its form, the reflective coating 5 follows the changed functional coating 19. Therefore, there is also a change in the surface form of the mirror 1. There is then a depression or an elevation in the surface form in the bombarded region 19 of the mirror surface, even though the form of the mirror substrate 3 has remained unchanged. The reflective coating 5, too, has no variation in thickness as a result of the local reduction or increase in the density of the functional coating 11.

Figure 1C:
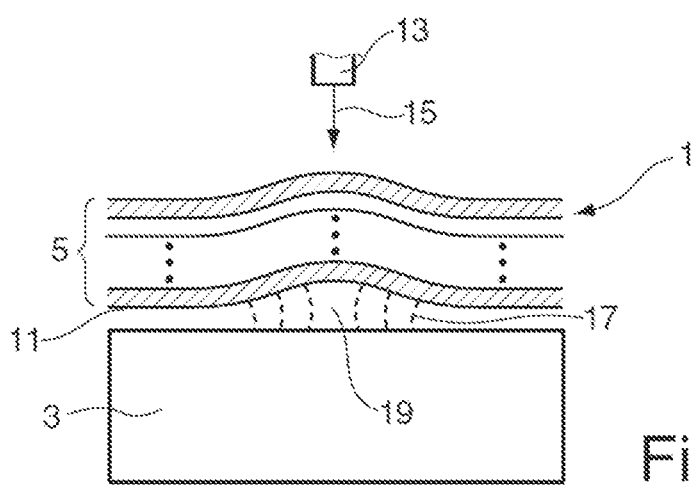

A decrease in the density of the functional coating 11, as shown in FIG. 1c, typically arises when the hydrogen-reactive material consists of carbon. In this case, the hydrogen ions react with the carbon to form volatile hydrocarbons, the density of which is less than the density of the carbon present there before the bombardment. In the case of carbon, the thickness of the functional coating 11 before the bombardment is typically approximately 1-50 nm. A decrease in the density may also be generated by the deposition of hydrogen ions in hydrogen-reactive materials such as silicon or rare earth metals. A densification of the hydrogen-reactive material, as shown in FIG. 1b, typically arises when the material consists of hydrocarbons, which can be converted by reaction with hydrogen into atomic carbon, e.g. as a reaction product of a physical interaction and, as a consequence thereof, of a chemical interaction.

By suitably selecting the operating parameters of the ion gun 13, it is possible to set and, if required, vary the spatial resolution of the local form variation of the functional coating 11. By suitably setting the operating parameters of the ion gun 13, it is also possible to ensure that the majority of the hydrogen ions 15 are deposited in a targeted manner in the functional coating 11, and not in the overlying reflective coating 5. For this purpose, it is possible in particular to select the kinetic energy of the hydrogen ions 15 depending on the thickness of the reflective coating 5, such that the depth of penetration thereof (on average) lies within the functional coating 11. The greater the thickness of the functional coating 11, typically the less stringent the demands made on the accuracy with which the depth of penetration has to be set.

In order to penetrate the reflective coating 5, it is typically necessary to generate rapid hydrogen ions with a kinetic energy of several 100 eV using the ion gun 13. Typically, a kinetic energy of 250 eV is required for each transition between an individual layer of molybdenum and an individual layer of silicon of the reflective coating 5.

In order to avoid the undesirable penetration of negatively charged ions into the reflective coating 5, either these can be filtered out of the particle beam generated by the ion gun 13 on the way to the mirror 1 by means of a suitable filter (typically in the form of an electric and/or magnetic field), or the material and/or the thickness of a surface layer of the reflective coating 5 can be set such that said layer serves as a filter, in order to almost completely prevent the penetration of negatively charged ions into the reflective coating 5.

Figure 2:
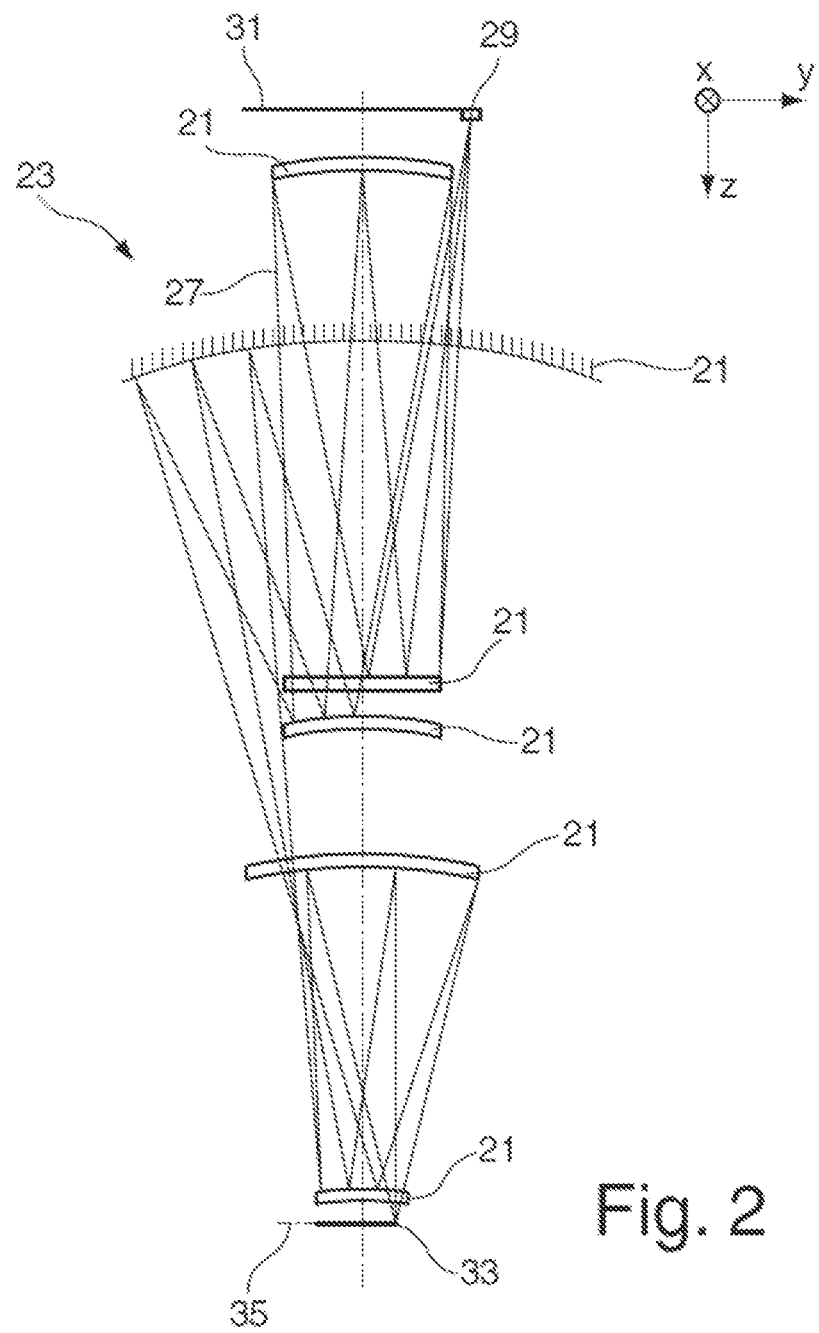
FIG. 2 shows a projection optical unit in which a mirror according to the invention can be used, FIG. 3a schematically shows a plan view of a surface to be corrected.

FIG. 2 shows an exemplary embodiment of a projection optical unit 23. With the aid of the projection optical unit 23, a structure-bearing mask 29 arranged in an object plane 31 is imaged onto an image 33 in an image plane 35. A photosensitive layer that changes chemically as a result of the exposure is arranged in the image plane 35. This is referred to as a so-called lithographic step. In the present exemplary embodiment, the projection optical unit 23 comprises six mirrors 21 used for imaging the structure-bearing mask 29 into the image plane 35. Such a projection lens 23 is usually diffraction-limited, such that the maximum possible resolution can be achieved only when the wavefront aberrations of the projection optical unit are sufficiently small.

In the case of diffraction-limited projection optical units, it is necessary for the RMS (root mean square) value to be less than $1/14$ of the wavelength of the imaging light. In order to achieve this, the surface form of the mirrors 21 has to be set highly precisely. Furthermore, the mirrors 21 likewise have to be positioned very precisely. In addition to projection optical units which comprise only mirrors as optical components, as in the embodiment shown in FIG. 2, the invention can also be employed in the case of so-called catadioptric projection lenses. Catadioptric projection lenses contain both reflective and refractive optical elements. Projection lenses of this type are usually used if the imaging light has a wavelength in the region of 193 nm or 248 nm.

Figure 3A:
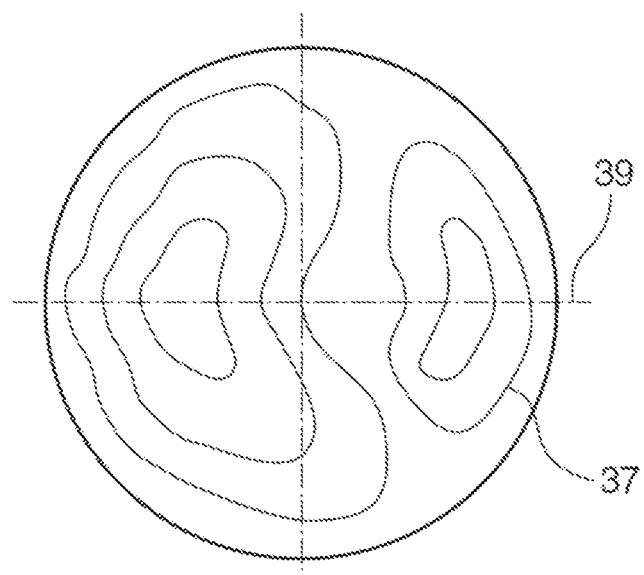
FIG. 3b shows a section through the surface to be corrected shown in FIG. 3a, FIG. 4 shows, on the basis of a flow chart, a method for correcting the surface form of a mirror.
Figure 3B:
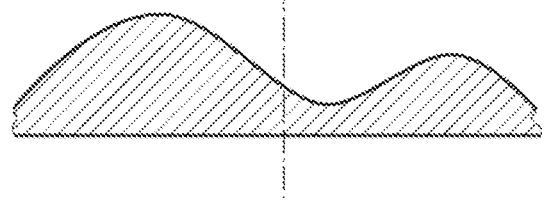

FIGS. 3a,b show, by way of example, the surface form to be corrected of a mirror. The deviation between the actual surface form and the desired surface form is shown with the aid of the contour lines 37 in FIG. 3a. Furthermore, FIG. 3b shows the height profile of this deviation along the line 39 in FIG. 3a. Such deviations shown can be determined with the aid of an interferometric measurement method, for example.

Figure 4:
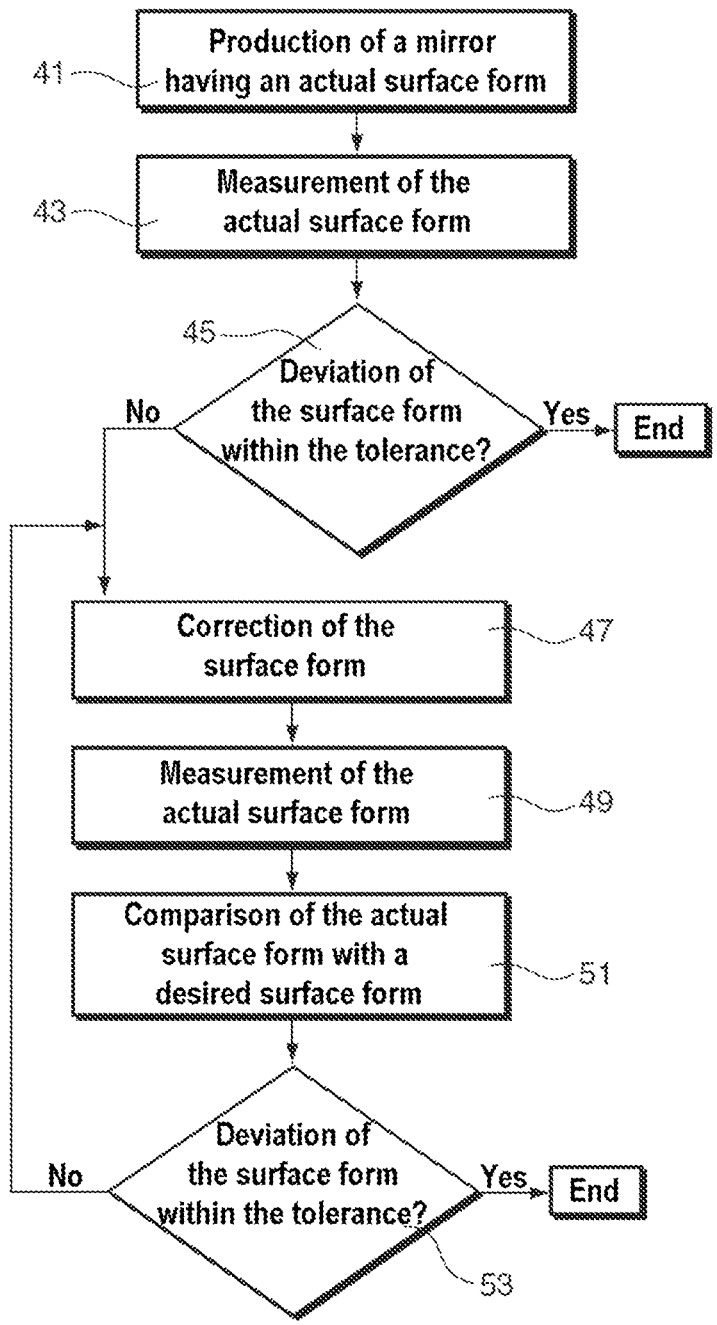

FIG. 4 shows the method according to the invention for correcting a surface form of a mirror by way of example on the basis of a flow chart. Firstly, in step 41, a mirror having an actual surface form is produced. This mirror then already comprises a substrate and a reflective coating. Afterward, in step 43, the actual surface form of the mirror is accurately measured. An interferometric measurement method as described, for example, in EP 1306698 A1 is usually used for this purpose. In step 45, the measured actual surface form is then compared with the desired surface form sought. If the two surface forms correspond within the desired tolerance, then the method is already concluded.

If a deviation of the surface form which lies outside the tolerance is present, then a correction of the surface form is performed next in step 47. This method step 47 comprises the bombardment of the mirror with particles in the manner described above. In the correction step, at least a local irreversible change is made in the density of the material of a functional coating 11 between the substrate 3 and the reflective coating 5, as described on the basis of FIG. 1b and FIG. 1c. After this correction of the surface form, the actual surface form is measured again in step 49. In step 51, this actual surface form is then compared again with the desired surface form. In method step 53, a check is then made to determine whether the actual surface form now corresponds to the desired surface form within the tolerance. If the result is positive, then the method is concluded at this point.

If a deviation outside the tolerance still results, then the method is continued again with the correction of the surface form in step 47. Depending on the magnitude of the deviation to be corrected between the actual surface form and the desired surface form, repeated application of this described correction loop of steps 47, 49, 51 and 53 may be necessary. In contrast to other methods for correcting a surface form of a mirror, such as are known from the prior art, the method according to the invention does not necessarily have a method step in which the reflective coating of the mirror is removed or reapplied. The method can therefore be carried out particularly rapidly and cost-effectively. However, it is also conceivable to supplement the method by such a step, if for example damage to the reflective coating has occurred.

Figure 5:
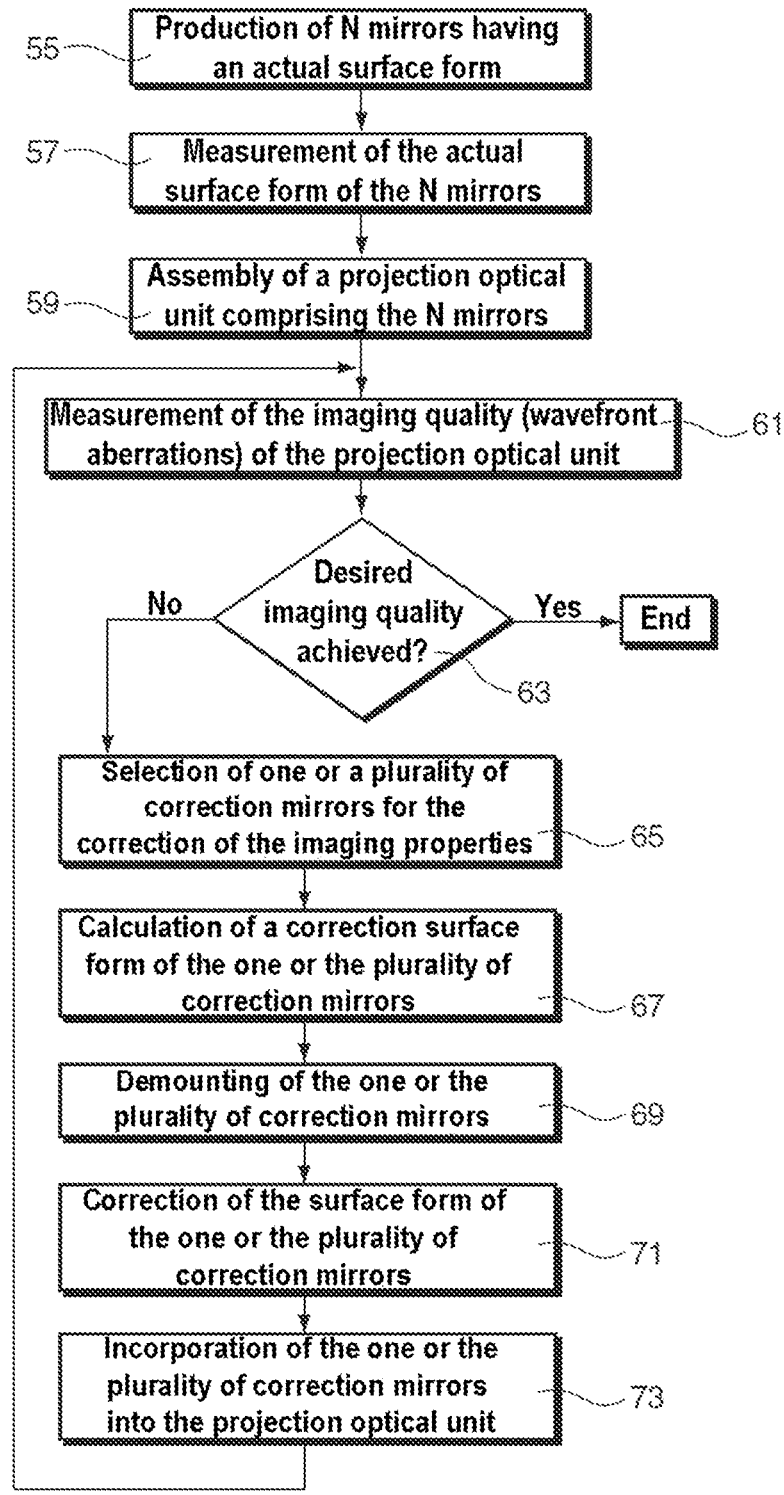
FIG. 5 shows, on the basis of a flow chart, a method for correcting the imaging quality of a projection optical unit by correction of the surface form of a mirror.

FIG. 5 shows the method according to the invention for correcting the imaging properties of a projection optical unit of a microlithography projection exposure apparatus on the basis of a flow chart. In a first step 55, a plurality N of mirrors which are required for the projection optical unit are produced. On account of the production accuracy, these N mirrors have an actual surface form that can deviate from the desired surface form sought. In an optional step 57, the present actual surface form of the N mirrors is measured with the aid of an interferometric measurement method. It becomes clear from the further method that an exact knowledge of the actual surface form of all N mirrors is not absolutely necessary for carrying out the method if the deviation of the actual surface form from the desired surface form sought is not all that large. Therefore, step 57 can be dispensed with, if appropriate.

In the next step 59, a projection optical unit is assembled from the N mirrors. The imaging properties of the projection optical unit are then measured in step 61. The wavefront aberrations of the entire projection lens are measured in this step 61. This is likewise done with the aid of interferometric measurement methods, such as, for example, by the methods described in EP 1306698 A1. In method step 63, a check is then made to determine whether the wavefront aberrations of the projection optical unit are sufficiently small. For a good imaging quality of the projection optical unit, it is necessary for the RMS value of the wavefront aberrations to be less than $1/14$ of the wavelength of the imaging light used. If the wavefront aberrations are already sufficiently small, then the method is concluded at this point. Otherwise, it is necessary to perform a correction on the projection optical unit. In addition to changing the position of individual mirrors within the projection optical unit, it is possible to perform a correction of the wavefront aberrations by the correction of the surface form of one or more mirrors of the projection optical unit. In this case, it is not absolutely necessary for a correction of the surface form of all mirrors of the projection optical unit to be carried out.

Depending on the specific optical design of the projection optical unit, it may suffice if a correction of the surface form is carried out on a few, in particular only on one, of the mirrors. From the optical design of the projection optical unit, it is possible to determine, for example, how the wavefront aberrations of the projection optical unit change if the surface form of a specific mirror is changed. It may emerge, for example, that, in the case of a first mirror, only a small change in the surface form is necessary for the correction of the wavefront aberrations, whereas a much greater change in the surface form is necessary in the case of a different, second mirror. Furthermore, specific profiles of the wavefront aberrations of the projection optical unit can be corrected only with the aid of the change in the surface form of mirrors which have a specific position within the imaging beam path of the projection optical unit.

For this reason, the next step 65 involves making a suitable selection of correction mirrors which are particularly suitable for bringing about a correction of the wavefront aberration by a change in the surface form. In step 67, a correction surface form is then calculated for this selection of correction mirrors with the aid of the measured wavefront aberrations and the optical design of the projection optical unit. If the actual surface form of all N mirrors has been measured in a step 57, and the exact position of all N mirrors is known, the surface form of the correction mirrors can be calculated absolutely. If a measurement of the actual surface form in step 57 has been dispensed with, then only a required relative change in the surface form of the correction mirrors can be determined from the wavefront aberrations and the optical design.

Both cases are combined below under the term correction surface form. A correction surface form can therefore be understood to mean an absolute surface form of the correction mirror or else the required relative change in the surface form of the correction mirror. It is often simpler to calculate only the required change in the surface form, since the absolute actual surface form and position of all the mirrors are not necessarily known exactly enough. Therefore, only the necessary difference with respect to the possibly unknown actual surface form is calculated. Step 69 consists in the demounting of the one or the plurality of correction mirrors selected in the preceding steps. Next, in step 71, a correction of the surface form of the one or the plurality of correction mirrors is carried out with the aid of the calculated correction surface form. In this case, the correction of the surface form of the one or the plurality of correction mirrors is effected with the aid of a correction method as described with reference to FIGS. 1a-c and FIG. 3. In the next step 73, the correction mirrors thus treated are incorporated into the projection optical unit again.

If appropriate, the correction of the surface form of the mirror can also be effected in situ, i.e. in the state incorporated in the projection optical unit. In this case, it is of course possible to dispense with steps 69 and 73 (demounting and incorporation of the mirror). The imaging quality of the projection optical unit can then be determined again in method step 61. Afterward, in method step 63, a check is made to determine whether the measured wavefront aberrations are sufficiently small, such that a sufficient imaging quality is ensured. If this is the case, then the method according to the invention is concluded at this point. Otherwise, a further correction loop comprising steps 65, 67, 69, 71 and 73 is carried out. On account of the stringent requirements in respect of the wavefront aberrations of the projection optical unit, it may be necessary that the correction loop described has to be carried out repeatedly until a sufficient imaging quality is achieved.

The above description of the various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A mirror for a microlithography projection exposure apparatus having a surface form and comprising a substrate, a reflective coating consisting of plural materials, and a functional coating between the substrate and the reflective coating,
   wherein the functional coating comprises a further material differing from any of the plural materials,
   wherein the further material is chemically reactive with particles deposited into the functional coating,
   wherein the functional coating has a local form variation correcting the surface form of the mirror through a local variation in chemical composition of the functional coating, and
   wherein the local variation in the chemical composition of the functional coating brings about no change in thickness of the reflective coating.

2. The mirror according to claim 1,
   wherein the functional coating comprises a hydrogen-reactive material.

3. The mirror according to claim 2,
   wherein the hydrogen-reactive material is selected from the group consisting of: carbon, silicon and hydrogen-reactive metals.

4. The mirror according to claim 1,
   wherein the local variation in the chemical composition of the functional coating generates a local increase in the volume of the functional coating.

5. The mirror according to claim 1,
   wherein the local variation in the chemical composition of the functional coating is irreversible.

6. A projection lens for a microlithography exposure apparatus comprising a mirror according to claim 1.

7. A microlithography projection exposure apparatus comprising a projection lens according to claim 6.

8. A method for correcting a surface form of a mirror comprising a substrate, a reflective coating consisting of plural materials and a functional coating arranged between the substrate and the reflective coating and comprising a further material differing from any of the plural materials,
   said method comprising:
   bombarding the functional coating with particles that chemically react with the further material present in the functional coating, to generate thereby a local form variation in the functional coating by a local variation in chemical composition of the functional coating, wherein the local variation in the chemical composition of the functional coating brings about no change in thickness of the reflective coating.

9. The method according to claim 8, further comprising providing the mirror with the reflective coating prior to effecting the local variation in the chemical composition of the functional coating, wherein the mirror has the reflective coating during the effecting.

10. The method according to claim 8,
    wherein the bombardment is carried out with charged particles in the form of hydrogen ions.

11. The method according to claim 8,
    wherein the particles are bombarded with a kinetic energy selected in accordance with a thickness of the reflective coating.

12. The method according to claim 8,
    wherein the local variation in the chemical composition of the functional coating generates a local increase in the volume of the functional coating.

13. The method according to claim 8,
    wherein the variation in the chemical composition is irreversible.

14. A method for correcting the imaging properties of a projection optical unit of a microlithography projection exposure apparatus comprising the method for correcting a surface form of a mirror of the projection optical unit according to claim 8.

15. A method for correcting the imaging properties of a projection optical unit of a microlithography projection exposure apparatus comprising:
    a. determining wavefront aberrations of the projection optical unit,
    b. calculating a correction surface form of at least one mirror from the wavefront aberrations of the projection optical unit, and
    c. correcting a surface form of the at least one mirror by the method according to claim 8.

16. The method according to claim 8,
    wherein the functional coating comprises a hydrogen-reactive material, and the hydrogen-reactive material is selected from the group consisting of: carbon, silicon and hydrogen-reactive metals.

* * * * *